United States Patent
Tanomura et al.

(10) Patent No.: US 8,332,190 B2
(45) Date of Patent: Dec. 11, 2012

(54) CIRCUIT SIMULATOR, CIRCUIT SIMULATION METHOD AND PROGRAM

(75) Inventors: Masahiro Tanomura, Minato-ku (JP); Naotaka Kuroda, Minato-ku (JP); Masafumi Kawanaka, Minato-ku (JP)

(73) Assignee: NEC Corporation, Tokyo (JP)

( * ) Notice: Subject to any disclaimer, the term of this patent is extended or adjusted under 35 U.S.C. 154(b) by 682 days.

(21) Appl. No.: 12/517,258

(22) PCT Filed: Dec. 13, 2007

(86) PCT No.: PCT/JP2007/074033
§ 371 (c)(1),
(2), (4) Date: Jun. 2, 2009

(87) PCT Pub. No.: WO2008/075611
PCT Pub. Date: Jun. 26, 2008

(65) Prior Publication Data
US 2010/0057412 A1    Mar. 4, 2010

(30) Foreign Application Priority Data

Dec. 19, 2006  (JP) .................................. 2006-341276

(51) Int. Cl.
G06F 17/50 (2006.01)
H01L 21/82 (2006.01)

(52) U.S. Cl. ............... 703/2; 703/14; 703/19; 327/334; 327/512

(58) Field of Classification Search ........... 703/2, 14, 703/17, 19; 327/334
See application file for complete search history.

(56) References Cited

U.S. PATENT DOCUMENTS

| | | | |
|---|---|---|---|
| 2002/0107675 A1* | 8/2002 | Shinzawa | 703/2 |
| 2005/0273309 A1* | 12/2005 | Yoneyama et al. | 703/14 |
| 2006/0279349 A1* | 12/2006 | Grudin et al. | 327/334 |
| 2007/0244676 A1* | 10/2007 | Shang et al. | 703/2 |
| 2009/0295457 A1* | 12/2009 | Mowry et al. | 327/512 |

FOREIGN PATENT DOCUMENTS

| | | |
|---|---|---|
| JP | 08-327698 A | 12/1996 |
| JP | 10-261783 A | 9/1998 |
| JP | 11-175576 A | 7/1999 |
| JP | 2001-291723 A | 10/2001 |
| JP | 2005-346527 A | 12/2005 |

* cited by examiner

*Primary Examiner* — Thai Phan
(74) *Attorney, Agent, or Firm* — Sughrue Mion, PLLC

(57) ABSTRACT

Characteristics of a circuit element are predicted accurately by taking account not only of the temperature variation due to self-heating of the element but also of temperature variation due to heat transmission from an adjoining heater element. With reference to an electric network supplied from an electric network input unit (2) and a heat network supplied from a heat network input unit (3), a simulation unit (4) determines a first heat generation temperature resulting from the amount of self-heat generation of that element and a second heat generating temperature resulting from the amount of heat flowing into that element from other elements, respectively, for a plurality of elements which make up a semiconductor integrated circuit, calculates the element temperature of that element based on the first and second heat generation temperatures, and then calculates the voltage value and the current value in the element at that element temperature based on previously provided data indicative of temperature dependency of that element.

28 Claims, 5 Drawing Sheets

$Q(n,m,k) = A \times Q(m,k)$ $Q(m,k) = V(m,k) \times I(m,k)$ $Ic(n,m,k) = \alpha \times Ic(m,k)$ $Ic(n,m,k)$ :Variable which is produced by replacing $Q(n,m,k)$ with current.

$Ic(m,k)$ :Variable which is produced by replacing $Q(m,k)$ with current.

$\alpha$ :Current gain

CIRCUIT SIMULATOR, CIRCUIT SIMULATION METHOD AND PROGRAM

TECHNICAL FIELD

The present invention relates to a circuit simulator for use in circuit designing of semiconductor integrated circuits, and more particularly, to a circuit simulator for performing circuit designing of semiconductor integrated circuits which comprise a circuit comprised of a plurality of elements which are connected and at least one of which is a heat generating element.

BACKGROUND ART

JP-8-327698-A describes a circuit simulation method which is capable of making a design taking into consideration self-heat generation of a circuit in which a plurality of circuit elements are connected. This circuit simulation method first calculates the magnitude of current and voltage of each circuit element, which forms part of the circuit, at temperature T which is given when self-heat generation is not taken into consideration (first step). Then, the circuit simulation method senses the magnitude of current flowing through each circuit element, which varies depending on the power consumption of the circuit, calculates temperature variation $\Delta T$ from a variation in power consumption of the circuit due to this variation in current, and sets the temperature $(T+\Delta T)$ to new temperature T (second step). The voltage or current can be calculated taking into consideration the heat generated by the circuit element by alternately repeating the first and second steps until the circuit state converges.

JP-11-175576-A in turn discloses a system for verifying a layout using a heat circuit network. This layout verification system first creates a circuit diagram from the result of a layout performed based on logic circuits, and calculates a current density of each wiring segment using the circuit diagram. Next, the system creates a heat circuit from the circuit diagram, calculates the temperature of each wiring segment using the heat circuit, and derives an allowable current density of each wiring segment based on that temperature. Then, the system compares the current density of each wiring segment derived from the circuit diagram with the allowable current density of each wiring segment derived from the heat circuit for verification.

DISCLOSURE OF THE INVENTION

In recent years, semiconductor integrated circuits have been increasingly miniaturized and reduced in size, and as a result, the temperature rises not only due to a temperature increase caused by self-heat generation of elements which make up a circuit, but also due to heat transfer from adjoining heat generating elements, leading to changes in current/voltage characteristics of non-heat generating elements, thus making it more and more difficult to precisely estimate the characteristics of circuit elements.

Since neither the simulation method described in JP-8-327698-A nor the verification system described in JP-11-175576-A is configured to perform a simulation that takes into consideration the influence of heat between heat-generating elements, it is difficult to accurately verify heat transfers between heat-generating elements. In addition, since the verification system described in JP-11-175576-A uses a heat circuit which includes a resistor, acting as heat conductance, placed between heat flow sources which act as heat-generating elements, the system fails to precisely represent heat transfers between heat-generating elements.

It is an object of the present invention to solve the problems described above and to provide a circuit simulator, a circuit simulation method, and a program which are capable of precisely predicting characteristics of circuit elements that take into consideration not only temperature variation due to self-heat generation of the elements but also temperature variation due to heat transfer from adjoining heat generating elements.

To achieve the above object, a first circuit simulator of the present invention is characterized by comprising an electric circuit network input unit for inputting an electric circuit network that indicates a connection relation associated with a plurality of elements which make up a semiconductor integrated circuit, a heat circuit network input unit for inputting a heat circuit network which is a heat equivalent circuit associated with the plurality of elements, and a simulation unit that executes an electric circuit simulation for the semiconductor integrated circuit based on a first element temperature, a first voltage value, a first current value, and a thermal resistance value, which have been set for each of the plurality of elements as initial conditions, with reference to the electric circuit network supplied from the electric circuit network input unit and the heat circuit network supplied from the heat circuit network input unit, wherein the simulation unit calculates a first heat generation temperature for each of the plurality of elements, caused by the amount of self-heat generation of the pertinent element, based on the first voltage value, first current value, and thermal resistance value of the pertinent element, calculates a second heat generation temperature caused by the amount of heat flowing from the other element into the pertinent element based on the first voltage value and first current value of the other element and the thermal resistance value of the pertinent element, calculates a second element temperature of the pertinent element based on the first and second heat generation temperatures and the first element temperature of the pertinent element, and calculates a second voltage value and a second current value at the pertinent element at the second element temperature based on previously given data indicative of temperature dependency of the pertinent element.

A second circuit simulator of the present invention is characterized by comprising an electric circuit network input unit for inputting an electric circuit network that indicates a connection relation associated with a plurality of elements which make up a semiconductor integrated circuit, a heat circuit network input unit for inputting a heat circuit network which is a heat equivalent circuit associated with the plurality of elements, and a simulation unit that executes an electric circuit simulation for the semiconductor integrated circuit based on a first element temperature, a first voltage value, a first current value, and a first thermal resistance value, which have been set for each of the plurality of elements as initial conditions, with reference to the electric circuit network supplied from the electric circuit network input unit and the heat circuit network supplied from the heat circuit network input unit, wherein the simulation unit calculates a first heat generation temperature for each of the plurality of elements, caused by the amount of self-heat generation of the pertinent element, based on the first voltage value, first current value, and first thermal resistance value of the pertinent element, calculates a second heat generation temperature caused by the amount of heat flowing from the other element into the pertinent element based on the first voltage value and first current value of the other element and the first thermal resistance value of the pertinent element, calculates a second element temperature of the pertinent element based on the first and second heat generation temperatures and the first element temperature of the pertinent element, and calculates a second voltage value, a second current value, and a second thermal resistance value at the pertinent element at the second element temperature based on previously given data indicative of temperature dependency of the pertinent element.

A first circuit simulation method of the present invention is a method of simulating a semiconductor integrated circuit comprised of a plurality of elements, which comprises the step of:

executing an electric circuit simulation for the semiconductor integrated circuit based on a first element temperature, a first voltage value, a first current value, and a thermal resistance value set as initial conditions for each of the plurality of elements, with reference to an electric circuit network that indicates a connection relation associated with the plurality of elements and a heat circuit network which is a heat equivalent circuit associated with the plurality of elements, wherein the step of executing an electric circuit simulation includes the steps of calculating a first heat generation temperature for each of the plurality of elements, caused by the amount of self-heat generation of the pertinent element, based on the first voltage value, first current value, and thermal resistance value of the pertinent element, calculating a second heat generation temperature caused by the amount of heat flowing from the other element into the pertinent element based on the first voltage value and first current value of the other element and the thermal resistance value of the pertinent element, calculating a second element temperature of the pertinent element based on the first and second heat generation temperatures and the first element temperature of the pertinent element, and calculating a second voltage value and a second current value at the pertinent element at the second element temperature based on previously given data indicative of temperature dependency of the pertinent element.

A second circuit simulation method of the present invention is a method of simulating a semiconductor integrated circuit comprised of a plurality of elements, which comprises the step of:

executing an electric circuit simulation for the semiconductor integrated circuit based on a first element temperature, a first voltage value, a first current value, and a first thermal resistance value set as initial conditions for each of the plurality of elements, with reference to an electric circuit network that indicates a connection relation associated with the plurality of elements and a heat circuit network which is a heat equivalent circuit associated with the plurality of elements, wherein the step of executing an electric circuit simulation includes the steps of calculating a first heat generation temperature for each of the plurality of elements, caused by the amount of self-heat generation of the pertinent element, based on the first voltage value, first current value, and first thermal resistance value of the pertinent element, calculating a second heat generation temperature caused by the amount of heat flowing from the other element into the pertinent element based on the first voltage value and first current value of the other element and the first thermal resistance value of the pertinent element, calculating a second element temperature of the pertinent element based on the first and second heat generation temperatures and the first element temperature of the pertinent element, and calculating a second voltage value, a second current value, and a second thermal resistance value at the pertinent element at the second element temperature based on previously given data indicative of temperature dependency of the pertinent element.

A first program of the present invention is a program for causing a computer to execute processing for executing an electric circuit simulation for a semiconductor integrated circuit based on a first element temperature, a first voltage value, a first current value, and a thermal resistance value set as initial conditions for each of a plurality of elements which make up the semiconductor integrated circuit, with reference to an electric circuit network that indicates a connection relation associated with the plurality of elements and a heat circuit network which is a heat equivalent circuit associated with the plurality of elements, wherein the processing of executing an electric circuit simulation includes processing of calculating a first heat generation temperature for each of the plurality of elements, caused by the amount of self-heat generation of the pertinent element, based on the first voltage value, first current value, and thermal resistance value of the pertinent element, calculating a second heat generation temperature caused by the amount of heat flowing from the other element into the pertinent element based on the first voltage value and first current value of the other element and the thermal resistance value of the pertinent element, calculating a second element temperature of the pertinent element based on the first and second heat generation temperatures and the first element temperature of the pertinent element, and calculating a second voltage value and a second current value at the pertinent element at the second element temperature based on previously given data indicative of temperature dependency of the pertinent element.

A second program of the present invention is a program for causing a computer to execute processing of executing an electric circuit simulation for a semiconductor integrated circuit based on a first element temperature, a first voltage value, a first current value, and a first thermal resistance value set as initial conditions for each of a plurality of elements which make up the semiconductor integrated circuit, with reference to an electric circuit network that indicates a connection relation associated with the plurality of elements and a heat circuit network which is a heat equivalent circuit associated with the plurality of elements, wherein the processing of executing an electric circuit simulation includes processing of calculating a first heat generation temperature for each of the plurality of elements, caused by the amount of self-heat generation of the pertinent element, based on the first voltage value, first current value, and first thermal resistance value of the pertinent element, calculating a second heat generation temperature caused by the amount of heat flowing from the other element into the pertinent element based on the first voltage value and first current value of the other element and the first thermal resistance value of the pertinent element, calculating a second element temperature of the pertinent element based on the first and second heat generation temperatures and the first element temperature of the pertinent element, and calculating a second voltage value, a second current value, and a second thermal resistance value at the pertinent element at the second element temperature based on previously given data indicative of temperature dependency of the pertinent element.

Figure 1:
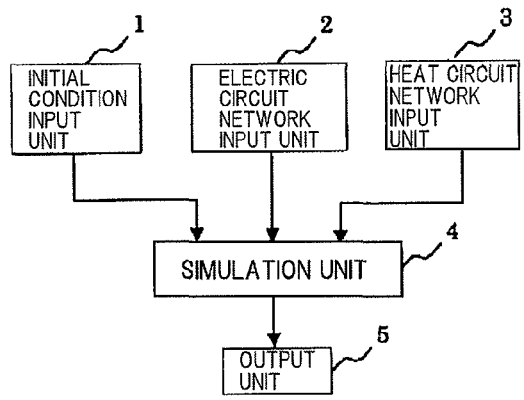
FIG. 1 A block diagram showing the configuration of a main portion of a circuit simulator which is a first exemplary embodiment of the present invention.

DESCRIPTION OF REFERENCE NUMERALS 1, 11 Initial Condition Input Units
2, 12 Electric Circuit Network Input Units
3 Heat Circuit Network Input Unit
4, 14 Simulation Units
5, 15 Output Units
13 Layout Input Unit
16 Heat Circuit Network Conversion Unit

BEST MODE FOR CARRYING OUT THE INVENTION

Next, embodiments of the present invention will be described with reference to the drawings.

First Exemplary Embodiment

FIG. 1 is a block diagram showing the configuration of a main portion of a circuit simulator which is a first exemplary embodiment of the present invention.

The circuit simulator of this embodiment is a simulator implemented by a computer system which is operated by a program, and is used, for example, for designing semiconductor integrated circuits. The main portion of this circuit simulator comprises initial condition input unit 1, electric circuit network input unit 2, heat circuit network input unit 3, simulation unit 4, and output unit 5, as shown in FIG. 1.

Electric circuit network input unit 2 supplies simulation unit 4 with an electric circuit network of a semiconductor integrated circuit which is subjected to a simulation. The electric circuit network is a circuit comprised of a plurality of elements which are connected, where at least one of the elements that forms part of the circuit is a heat-generating element. The electric circuit network is a circuit which is designed in units of circuit elements, for example, transistors, resistors and the like, and may be provided from an external computer device or created by the simulator. If the electric circuit network is created by the simulator, an application for creating the electric circuit network that has been previously prepared (installed in a storage unit, not shown) is run by a user through a manipulation unit (not shown) such as a keyboard to create an arbitrary electric circuit network.

Heat circuit network input unit 3 supplies simulation unit 4 with a heat circuit network of a semiconductor integrated circuit which is subjected to simulation. A creating method that has been used in existing heat circuit network methods is applied to create the heat circuit network. A heat circuit network is a heat equivalent circuit which is created in such a manner that: an object is defined as a part of a semiconductor integrated circuit which causes a heat transfer; the object is replaced with a thermal resistance which connects between nodes; and the thermal resistance between nodes (° C./W), temperature (° C.), and heat flow (W) are regarded as resistance (Q), voltage (V), and current (A), respectively. Like the electric circuit network, this heat circuit network may be provided from an external computer device or created by the simulator.

Initial condition input unit 1 supplies simulation unit 4 with initial conditions which have been set by the user through a manipulation unit, not shown. Parameters set as the initial conditions include the number N of elements which make up a circuit, temperature T, voltage V, current I, thermal resistance Rth, voltage convergence determination condition $\epsilon v$, current convergence determination condition $\epsilon i$, coefficients n, m indicating where an element is positioned in the N elements of the circuit, and variable k indicative of the number of repetitions.

Simulation unit 4 performs an electric circuit simulation for a semiconductor integrated circuit with reference to the electric circuit network supplied from electric circuit network input unit 2 and the heat circuit network supplied from heat circuit network input unit 3, and supplies the result to output unit 5. Output unit 5, which is a display device, for example, LCD (Liquid Crystal Display) or the like, provides the user with the simulation result supplied from simulation unit 4.

Figure 2:
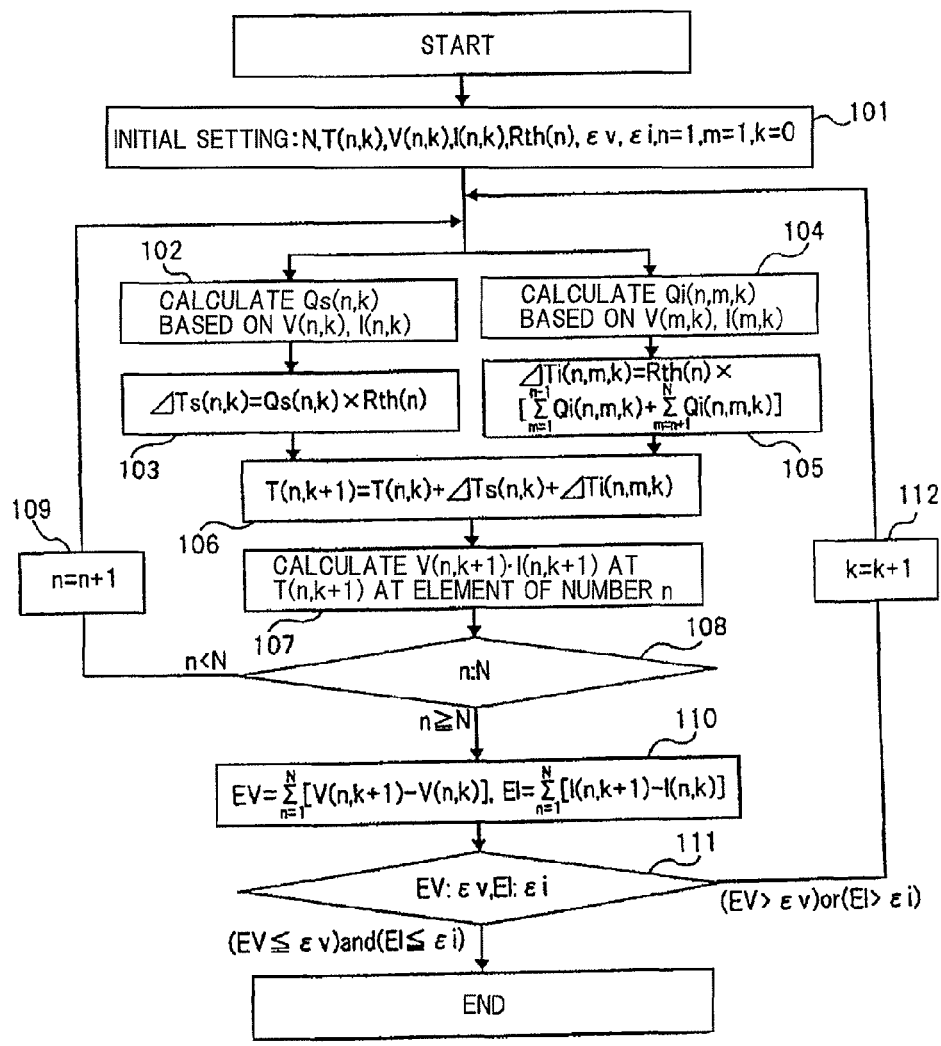
FIG. 2 A flow chart showing a processing procedure for an electric circuit simulation performed in the circuit simulator shown in FIG. 1.

FIG. 2 shows a processing procedure for an electric circuit simulation performed in the circuit simulator of this embodiment. In the following, an electric circuit simulation will be described specifically with reference to FIG. 2.

First, initial conditions are set for executing the electric circuit simulation (step 101). Specifically, the number of elements is designated by N; the temperature, voltage, current, and thermal resistance of an n-th element are designated by $T(n, k)$, $V(n, k)$, $I(n, k)$, and $Rth(n)$, respectively; the voltage and current of an m-th element are designated by $V(m, k)$ and $I(m, k)$, respectively; a voltage convergence determination condition is designated by $\epsilon v$; and current convergence determination condition is designated by $\epsilon i$. Then, variable k is set to zero, and coefficients n, m are respectively set to one. Coefficients n, m are respectively in a range of one or more to N or less.

After setting the initial conditions, self-heat generation amount $Qs(n, k)$ in the n-th element is calculated on the basis of voltage value $V(n, k)$ and current value $(n, k)$ in the n-th element (step 102), and self-heat generation temperature $\Delta Ts(n, k)$ at the n-th element is calculated on the basis of that self-heat generation amount $Qs(n, k)$ and thermal resistance value $Rth(n)$ in the n-th element (step 103). Further, simultaneously with this processing at steps 102, 103, or sequentially, heat amount $Qi(n, m, k)$ which flows from the m-th element into the n-th element is calculated on the basis of voltage value $V(m, k)$ and current value $I(m, k)$ in the m-th element (step 104). Then, a countable sum is calculated in a range where variable m of heat amount $Qi(n, m, k)$ changes from one to n−1, and in a range where variable m changes from n+1 to N, and heat generation temperature $\Delta Ti(n, m, k)$ at the n-th element, caused by the amount of heat flowing from the m-th element to the n-th element, is calculated on the basis of the countable sum and thermal resistance value $Rth(n)$ in the n-th element (step 105).

Next, temperature $T(n, k)$, self-heat generation temperature $\Delta Ts(n, k)$, and heat generation temperature $\Delta Ti(n, m, k)$ of the n-th element are added to designate the resulting value as element temperature $T(n, k+1)$ of the n-th element (step 106). Then, new voltage value $V(n, k+1)$ and current value $I(n, k+1)$ are calculated in the n-th element at element temperature $T(n, k+1)$ (step 107), and the value of coefficient n is compared with the value of the number N of elements (step 108). Here, new voltage value $V(n, k+1)$ and current value $I(n,$ k+1) in the n-th element are calculated on the basis of data indicative of previously given temperature dependency (voltage/current characteristics including the temperature) of the n-th element.

When it is determined at step 108 that the value of coefficient n is less than number N of elements, coefficient n is incremented by one to produce new coefficient n, followed by a transition to step 102 and step 104 (step 109). When it is determined at step 108 that coefficient n is equal to or more than number N of elements, a countable sum of the difference between voltage value V(n, k+1) calculated at step 107 and voltage value V(n, k) in the range of coefficient n from one to N is designated as voltage variation EV, and a countable sum of the difference between current value I(n, k+1) calculated at step 107 and current value I(n, k) in the range of coefficient n from one to N is designated as current variation EI (step 110). Then, voltage variation EV is compared with voltage convergence determination condition $\epsilon v$, while current variation EI is compared with current convergence determination condition $\epsilon i$, respectively (step 111).

When the value of EV is determined to be larger than the value of $\epsilon V$, or when the value of EI is determined to be larger than the value of $\epsilon i$ at step 111, the value of variable k is incremented by one to produce new variable k, followed by a transition to step 102 and step 104 (step 112). When it is determined at step 111 that the value of EV is equal to or less than the value of $\epsilon v$ and the value of EI is equal to or less than the value of $\epsilon i$, the simulation processing is terminated.

In the foregoing procedure for simulation processing, processing at steps 102-107 is repeatedly executed until $n \geq N$ is satisfied at step 108 after step 101 has been executed. Then, after step 110 has been executed, processing at steps 102-110 is repeatedly executed while changing each value of voltage value V(n, k) and current value I(n, k) until both EV and EI are determined to be equal to or less than the values of the convergence determination conditions at step 111. Through such repeated processing, a voltage, a current, and a temperature can be calculated taking into consideration the influence by respective self-heat generation of a plurality of elements which make up the circuit, and heat generation between the elements.

According to the circuit simulator of this embodiment, for each of a plurality of elements which make up a circuit, the simulator can calculate a temperature variation of the element due to its self-heat generation, and a temperature variation of the element due to heat transfer from other heat generating elements, so that the current/voltage characteristics of the element can be precisely defined on the basis of these temperature variations. The circuit simulator of this embodiment enables a precise simulation of a small semiconductor integrated circuit, and contributes to a reduction in the number of times of re-works and a saving in development cost.

Figure 3:
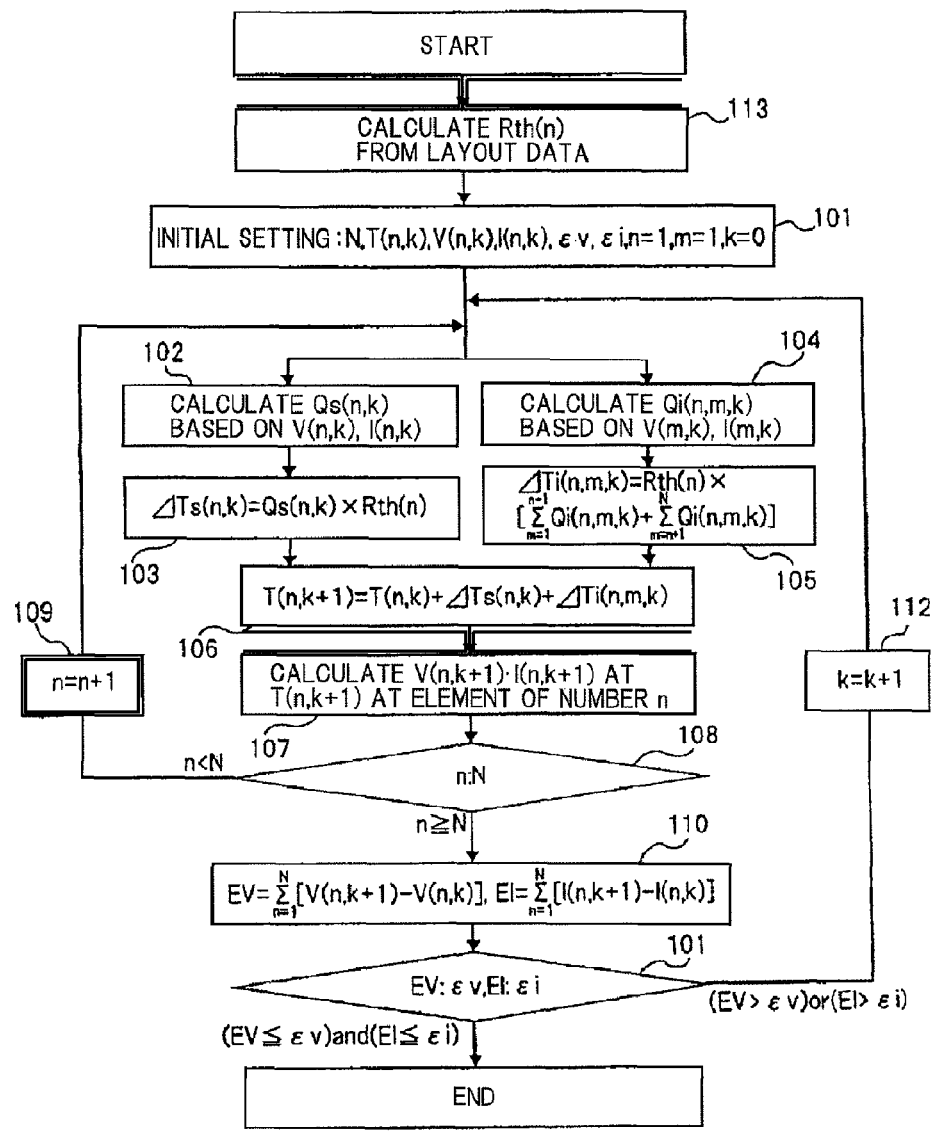
FIG. 3 A flow chart showing another processing procedure for an electric circuit simulation performed in the circuit simulator shown in FIG. 1.

The circuit simulator of this embodiment is an example of the present invention, and can be modified in configuration and operation as appropriate. For example, when a heat circuit network is generated from layout data, a step (113 in FIG. 3) may be added, before step 101 is executed, for deriving thermal resistance value Rth(n) in an n-th element using the element shape of the n-th element on the layout data, as shown in FIG. 3. In this way, since thermal resistance value Rth(n) at the n-th element is derived from the element shape of the layout data, a seamless design can be implemented, for example, across mask fabrication and a circuit design.

Alternatively, at step 104, the distance between the n-th element and m-th element is calculated on the basis of the layout data, and heat amount Qi(n, m, k) flowing from the m-th element into the n-th element may be derived on the basis of the distance between the elements and on the basis of voltage value V(m, k) and current value I(m, k) in the m-th element. In this event, a seamless design can also be implemented, for example, across mask fabrication and a circuit design.

Alternatively, heat amount Qi(n, m, k) may be represented by Qi(n, m, k)=A×[V(m, k)×I(m, k)], using coefficient A. In this event, coefficient A may depend on time. According to the use of time-dependent coefficient A, the voltage/current characteristics of the element can be simulated taking into consideration the transient response of heat (time transient response characteristic).

Figure 4:
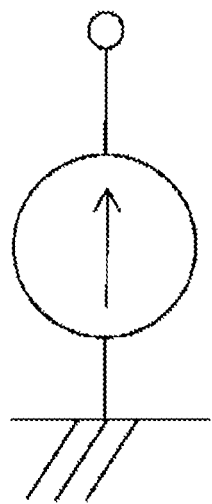
FIG. 4 A circuit diagram showing an exemplary current source element.

Further, given current source element 20 having one end grounded as shown in FIG. 4, coefficient A may be represented by current gain $\alpha$ of the current source element when heat amount Qi(n,m,k) is calculated for this current source element 20. Specifically, when the values of voltage and current at an m-th element are given by voltage value V(m,k) and current value I(m,k), respectively, self-heat generation amount Qs(m,k) of the m-th element is given by:

$$Qs(m,k)=V(m,k) \times I(m,k),$$

and heat amount Qi(n,m,k) is given by:

$$Qi(n,m,k)=A \times Qs(m,k)$$

Then, as heat amount Qi(n,m,k) is replaced with the current to produce variable lc(n,m,k), and self-heat generation amount Qs(m,k) is replaced with the current to produce variable lc(m,k), the following relationship is established:

$$lc(n,m,k)=\alpha \times lc(m,k)$$

Based on these relationships, coefficient A can be represented by current gain $\alpha$ of the current source element. In this way, a heat circuit network and an electric circuit network can be precisely and simultaneously simulated using the electric circuit simulator. The reason for the above will be briefly described below.

The current/voltage characteristics of a semiconductor device depend on the temperature and time. For simulating the current/voltage characteristics of a semiconductor device taking into consideration the temperature and time, it is necessary to simultaneously simulate a heat circuit network and an electric circuit network in an electric circuit simulator. An existing heat simulator based on a finite element method can calculate the temperature but cannot simulate the voltage/current characteristics. Since the electric circuit simulator performs a simulation in conformity with basic laws of electricity (Ohm's law, Kirchhoff's law, Joule's law and the like), it can simultaneously simulate an electric circuit network and a heat circuit network. Since a heat circuit network can be converted to an electric circuit network, temperature can be converted to voltage; heat can be converted to current; and thermal resistance can be converted to a resistance. Further, as an object of heat transfer is converted to a current source, the current source can be represented by a function of frequency, thus making it possible to simultaneously simulate a heat circuit network and an electric circuit network, including the time which is the inverse of frequency. In this way, the electric circuit simulator of this embodiment can precisely simulate the voltage/current characteristics of an element taking into consideration the transient response of heat.

Also, heat amount Qi(n, m, k) may be represented by Qi(n, m, k)=B×[T(m, k)−T(m, 0)] using coefficient B. In this event, coefficient B may also depend on the time. By using a coefficient depending on time, the voltage/current characteristics of an element can be simulated taking into consideration the transient response of heat (time transient response characteristic).

Figure 5:
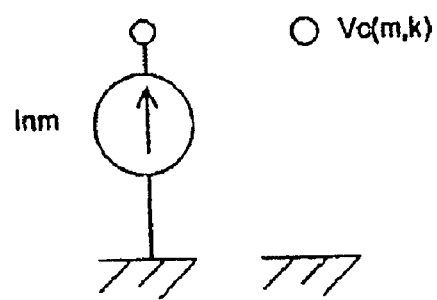
FIG. 5 A circuit diagram showing an exemplary voltage controlled current source element.

Further, when a voltage controlled current source element as shown in FIG. 5, to which current Inm (corresponding to a heat amount) flowing from an m-th element to an n-th element and voltage Vc(m, k) are applied, is given and when heat amount Qi(n, m, k) is calculated for this voltage controlled current source element, coefficient B may be represented by transconductance g of the voltage controlled current source element. Specifically, when the temperature of the m-th element is designated by T(m, k), heat amount Qi(n, m, k) flowing from the m-th element to the n-th element is given by:

$$Qi(n,m,k)=B \times T(m,k)$$

Then, the following relationship is established:

$$Ic(n,m,k)=g \times Ic(m,k)$$

where Ic(n, m, k) is a variable in which Qi(n, m, k) is replaced with a current, and Vc(m, k) indicates the value of ΔT, which is the magnitude of variation in T(m, k), replaced by the voltage. Based on these relationships, coefficient B can be represented by transconductance g of the voltage controlled current source element. In this way, a heat circuit network and an electric circuit network can be simultaneously and precisely simulated using the electric circuit simulator.

Second Exemplary Embodiment

Figure 6:
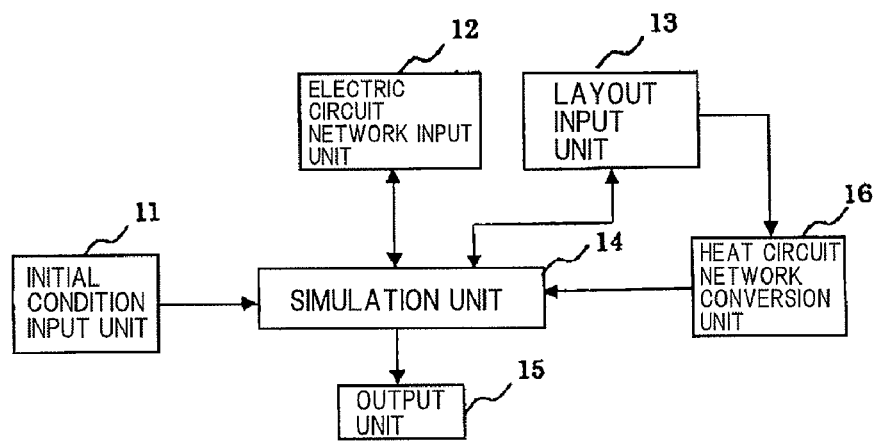
FIG. 6 A block diagram showing the configuration of a main portion of a circuit simulator which is a second exemplary embodiment of the present invention.

FIG. 6 is a block diagram showing the configuration of a main portion of a circuit simulator which is a second exemplary embodiment of the present invention.

The circuit simulator of this embodiment is a simulator implemented by a computer system which is operated by a program, and is used, for example, for designing semiconductor integrated circuits. The main portion of this circuit simulator comprises initial condition input unit 11, electric circuit network input unit 12, layout input unit 13, simulation unit 14, and output unit 15, and neat circuit network conversion unit 16, as shown in FIG. 6. Electric circuit network input unit 12 and output unit 15 are the same as those shown in FIG. 1.

Initial condition input unit 11 supplies simulation unit 4 with initial conditions which have been set by the user through a manipulation unit, not shown. Parameters set as the initial conditions include the number N of elements which make up a circuit, temperature T, voltage V, current I, thermal resistance Rth, voltage convergence determination condition εV, thermal resistance convergence determination condition εr, current convergence determination condition εi, coefficients n, m indicating where an element is positioned in the N elements of the circuit, and variable k indicative of the number or repetitions.

Layout input unit 13 supplies simulation unit 14 with layout data of a semiconductor integrated circuit which is subjected to a simulation. The layout data represents a circuit diagram which includes placement of unit cells which define elements, wires and the like which make up a semiconductor integrated circuit, and may be provided from an external computer device or created by the simulator.

Heat circuit network conversion unit 16 converts the layout data created by layout input unit 13 to a heat circuit network. In the conversion from layout data to a heat circuit network, a portion (object) which causes a heat transfer is replaced with a thermal resistance which connects between nodes, and the thermal resistance between nodes (° C./W), temperature (° C.), and heat flow (W) are regarded as resistance (Ω), voltage (V), and current (A), respectively, to create a heat equivalent circuit.

Simulation unit 14 performs an electric circuit simulation for a semiconductor integrated circuit with reference to an electric circuit network supplied from electric circuit network input unit 12, the layout data supplied from layout input unit 13, and the heat circuit network supplied from heat circuit network conversion unit 16, and supplies the result to output unit 15.

Figure 7:
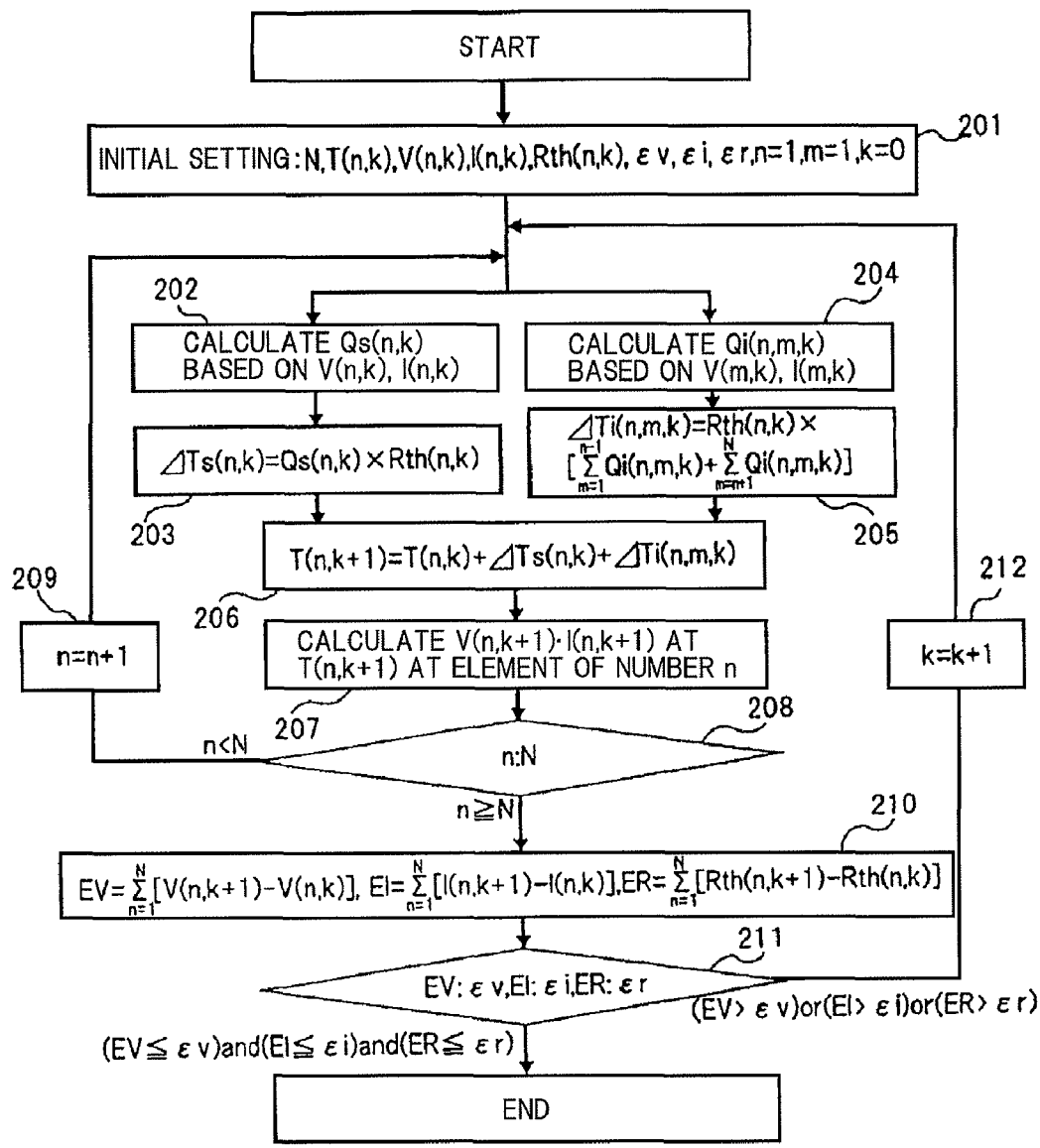
FIG. 7 A flow chart showing a processing procedure for an electric circuit simulation performed in the circuit simulator shown in FIG. 6.

FIG. 7 shows a processing procedure for an electric circuit simulation performed in the circuit simulator of this embodiment. In the following, the electric circuit simulation will be described specifically with reference to FIG. 7.

First, initial conditions are set for executing the electric circuit simulation (step 201). Specifically, the number of elements is designated by N; the temperature, voltage, current, and thermal resistance of an n-th element are designated by T(n, k), V(n, k), I(n, k), and Rth(n, k), respectively; the voltage and current of an m-th element are designated by V(m, k) and I(m, k), respectively; a voltage convergence determination condition is designated by εv; current convergence determination condition is designated by εi; and a thermal resistance convergence determination condition is designated by εr. Variable k is set to 0, and coefficients n, m are respectively set to one. Coefficients n, m are respectively in a range of one or more to N or less.

After setting the initial conditions, self-heat generation amount Qs(n, k) in the n-th element is calculated on the basis of voltage value V(n, k), current value (n, k) in the n-th element, and thermal resistance value Rth(n, k) (step 202), and self-heat generation temperature ΔTs(n, k) at the n-th element is calculated on the basis of self-heat generation amount Qs(n, k) and thermal resistance value Rth(n, k) in the n-th element (step 203). Further, simultaneously with this processing at steps 202, 203, or sequentially, heat amount Qi(n, m, k) which flows from the m-th element into the n-th element is calculated on the basis of voltage value V(m, k) and current value I(m, k) in the m-th element (step 204). Then, a countable sum is calculated in a range where variable m of heat amount Qi(n, m, k) changes from one to n−1, and in a range where variable m changes from n+1 to N, and heat generation temperature ΔTi(n, m, k) at the n-th element, caused by a heat amount flowing from the m-th element to the n-th element, is calculated on the basis of the countable sum and thermal resistance value Rth(n, k) in the n-th element (step 205).

Next, temperature T(n, k), self-heat generation temperature ΔTs(n, k), and heat generation temperature ΔTi(n, m, k) of the n-th element are added to designate the resulting value as element temperature T(n, k+1) of the n-th element (step 206). Then, new voltage value V(n, k+1), current value (n, k+1), and thermal resistance value Rth(n, k+1) are calculated in the n-th element at element temperature T(n, k+1) (step 207), and the value of coefficient n is compared with the value of the number N of element (step 208). Here, new voltage value V(n, k+1), current value I(n, k+1), and thermal resistance value Rth(n, k+1) in the n-th element are calculated on the basis of data indicative of previously given temperature dependency (voltage/current characteristics including the temperature) of the n-th element.

When it is determined at step 208 that the value of coefficient n is less than number N of elements, coefficient n is incremented by one to produce new coefficient n, followed by a transition to step 202 and step 204 (step 209). When it is determined at step 208 that coefficient n is equal to or more than number N of elements, a countable sum of the difference between voltage value V(n, k+1) calculated at step 207 and voltage value V(n, k) in the range of coefficient n from one to N is designated as voltage variation EV, a countable sum of the difference between current value I(n, k+1) calculated at step 207 and current value I(n, k) in the range of coefficient n from one to N is designated as current variation EI, and a countable sum of the difference between thermal resistance value Rth(n, k+1) calculated at step 207 and thermal resistance value Rth(n, k) in the range of coefficient n from one to N is designated as thermal resistance value Rth(n, k) (step 210). Then, voltage variation EV is compared with voltage convergence determination condition $\epsilon v$, current variation EI is compared with current convergence determination condition $\epsilon i$, and thermal resistance variation ER is compared with thermal resistance convergence determination condition $\epsilon r$, respectively (step 211).

When the value of EV is determined to be larger than the value of $\epsilon v$, or when the value of EI is determined to be larger than the value of $\epsilon i$, or when the value of ER is determined to be larger than the value of $\epsilon r$ at step 211, the value of variable k is incremented by one to produce new variable k, followed by a transition to step 202 and step 204 (step 212). When it is determined at step 211 that the value of EV is equal to or less than the value of $\epsilon v$, the value of EI is equal to or less than the value of $\epsilon i$, and the value of ER is equal to or less than the value of $\epsilon r$, the simulation processing is terminated.

In the foregoing procedure of simulation processing, the processing at steps 202-207 is repeatedly executed until $n \geq N$ is satisfied at step 208 after step 201 has been executed. Then, after step 210 has been executed, the processing at steps 202-210 is repeatedly executed while changing each value of voltage value V(n, k), current value I(n, k), and thermal resistance value Rth(n, k) until the respective values of EV, EI, and ER are determined to be equal to or less than the values of the convergence determination conditions, respectively, at step 211. Through such repeated processing, a voltage, a current, and a temperature can be calculated taking into consideration the influence by respective self-heat generation of a plurality of elements which make up the circuit, and heat generation between the elements.

According to the circuit simulator of this embodiment, in addition to the effects of the first embodiment, the dependence on temperature with regard to the thermal resistance can also be precisely calculated, thus making it possible to precisely calculate a temperature variation of a circuit caused by heat generation to find the current/voltage characteristics of an element associated with the temperature variation. Consequently, the circuit simulator of this embodiment enables a precise simulation of a small semiconductor integrated circuit, and contributes to a reduction in the number of times of re-works and a saving in development cost.

The circuit simulator of this embodiment is an example of the present invention, and can be modified in configuration and operation as appropriate. For example, in the processing procedure shown in FIG. 7, a step may be added, before step 201, for deriving thermal resistance at an n-th element using the element shape of the n-th element of the layout data. In this way, a seamless design can be implemented, for example, across mask fabrication and a circuit design by deriving thermal resistance value Rth in the n-th element from the element shape of the layout data.

Alternatively, at step 204, the distance between the n-th element and m-th element is calculated on the basis of the layout data, and heat amount Qi(n, m, k) flowing from the m-th element into the n-th element may be derived on the basis of the distance between the elements and on the basis of voltage value V(m, k) and current value I(m, k) in the m-th element. In this event, a seamless design can be implemented across mask fabrication and a circuit design.

Alternatively, heat amount Qi(n, m, k) may be represented by Qi(n, m, k)=A×[V(m, k)×I(m, k)], using coefficient A as is the case with the first embodiment. In this event, coefficient A may depend on time. According to the use of time-dependent coefficient A, the voltage/current characteristics of the element can be simulated taking into consideration the transient response of heat (time transient response characteristic). Further, when the current source element shown in FIG. 4 is given and when heat amount Qi(n, m, k) is calculated for the current source element, coefficient A may be represented by current gain a of the current source element. In this way, a heat circuit network and an electric circuit network can be precisely and simultaneously simulated using the electric circuit simulator.

Also, heat amount Qi(n, m, k) may be represented by Qi(n, m, k)=B×[T(m, k)−T(m, 0)] using coefficient B as is the case with the first embodiment. In this event, coefficient B may also depend on the time. By using a coefficient that is dependent on time, the voltage/current characteristics of an element can be simulated taking into consideration the transient response of heat (time transient response characteristic). Further, when the voltage controlled current source element shown in FIG. 5 is given and when heat amount Qi(n, m, k) is calculated for this voltage controlled current source element, coefficient B may be represented by transconductance g of the voltage controlled current source element. In this way, a heat circuit network and an electric circuit network can be simultaneously and precisely simulated using the electric circuit simulator.

The electric circuit simulation processing (the electric circuit simulation processing as shown in FIGS. 2, 3, 7) performed by the circuit simulator of each embodiment described above is basically implemented by a computer which executes a program. The program may be provided on a recording medium such as CD-ROM (Compact Disc Read Only Memory), DVD (Digital Versatile Disc) or the like, or may be provided through a network such as the Internet.

While the present invention has been described with reference to the embodiments, the present invention is not limited to the embodiments described above. The present invention can be modified in configuration and operation in various ways which can be understood by those skilled in the art without departing from the spirit of the present invention.

This application claims the priority of Japanese Patent Application No. 2006-341276 filed on Dec. 19, 2006, the disclosure of which is herein incorporated by reference in its entirety.

The invention claimed is:

1. A circuit simulator comprising:
   an electric circuit network input unit that inputs an electric circuit network that indicates a connection relation associated with a plurality of elements which make up a semiconductor integrated circuit;
   a heat circuit network input unit that inputs a heat circuit network which is a heat equivalent circuit associated with the plurality of elements; and
   a simulation unit that executes an electric circuit simulation for the semiconductor integrated circuit based on a first element temperature, a first voltage value, a first current value, and a thermal resistance value, which have been set for each of the plurality of elements as initial conditions, with reference to the electric circuit network supplied from said electric circuit network input unit and the heat circuit network supplied from said heat circuit network input unit,
   wherein said simulation unit calculates a first heat generation temperature for each of the plurality of elements, caused by the amount of self-heat generation of said each element, based on the first voltage value, first current value, and thermal resistance value of said each element, calculates a second heat generation temperature caused by the amount of heat flowing from the other element into said each element based on the first voltage value and first current value of the other element and the thermal resistance value of said each element, calculates a second element temperature of said each element based on the first and second heat generation temperatures and the first element temperature of said each element, and calculates a second voltage value and a second current value at said each element at the second element temperature based on previously given data indicative of temperature dependency of said each element.

2. The circuit simulator according to claim 1, wherein said simulation unit repeats a process, said process comprising: calculating the difference between the first voltage value and the second voltage value for each of the plurality of elements, and calculating a voltage variation which is an addition sum of the differences; calculating the difference between the first current value and the second current value for each of the plurality of elements, and calculating a current variation which is an addition sum of the differences; changing each value of the first voltage value and first current value until both the voltage variation and current variation decrease to previously set convergence condition values or less to calculate the second element temperature for each of the plurality of elements; and calculating the second voltage value and second current value at the second element temperature.

3. The circuit simulator according to claim 2, wherein:
when, the number of the plurality of elements is N, the number of times of repetitions is k for processing performed when at least one of the voltage variation and current variation exceeds a previously set convergence condition value, the amount of heat flowing from an m-th element ($1 \leq m \leq N$) into an n-th element ($1 \leq n \leq N$) of the plurality of elements is Qi(n,m,k), and the first voltage value and first current value of the m-th element are V(m,k) and I(m,k), respectively, said Qi(n,m,k) is given by:

$$Qi(n,m,k)=A \times [V(m,k) \times I(m,k)]$$

where A is a coefficient.

4. The circuit simulator according to claim 3, wherein said coefficient A is time dependent.

5. The circuit simulator according to claim 3, wherein said n-th element is a current source element, and said coefficient A is a current gain of said current source element.

6. The circuit simulator according to claim 2, wherein:
when, the number of the plurality of elements is N, the number of times of repetitions is k for processing performed when at least one of the voltage variation and current variation exceeds a previously set convergence condition value, the amount of heat flowing from an m-th element ($1 \leq m \leq N$) into an n-th element ($1 \leq n \leq N$) of the plurality of elements is Qi(n,m,k), an element temperature at the m-th element is T(m,0) when the k is zero, and the element temperature at the m-th element is T(m,k) when the k is other than zero, said Qi(n,m,k) is given by:

$$Qi(n,m,k)=B \times [T(m,k)-T(m,0)]$$

where B is a coefficient.

7. The circuit simulator according to claim 6, wherein said coefficient B is time dependent.

8. The circuit simulator according to claim 6, wherein said n-th element is a voltage controlled current source element, and said coefficient B is a transconductance of said voltage controlled current source element.

9. The circuit simulator according to claim 1, wherein said simulation unit is provided with layout data including shape data related to each of the plurality of elements, and derives the thermal resistance value for each of the plurality of elements using the shape data of an applicable element on the layout data.

10. The circuit simulator according to claim 1, wherein said simulation unit is provided with layout data including distance data between each element of the plurality of elements, and calculates the second heat generation temperature for each of the plurality of elements using applicable distance data between elements on the layout data instead of using the thermal resistance value.

11. A circuit simulator comprising:
an electric circuit network input unit that inputs an electric circuit network that indicates of a connection relation associated with a plurality of elements which make up a semiconductor integrated circuit;
a heat circuit network input unit that inputs a heat circuit network which is a heat equivalent circuit associated with the plurality of elements; and
a simulation unit that executes an electric circuit simulation for the semiconductor integrated circuit based on a first element temperature, a first voltage value, a first current value, and a first thermal resistance value, which have been set for each of the plurality of elements as initial conditions, with reference to the electric circuit network supplied from said electric circuit network input unit and the heat circuit network supplied from said heat circuit network input unit,
wherein said simulation unit calculates a first heat generation temperature for each of the plurality of elements, caused by the amount of self-heat generation of said each element, based on the first voltage value, first current value, and first thermal resistance value of said each element, calculates a second heat generation temperature caused by the amount of heat flowing from the other element into said each element based on the first voltage value and first current value of the other element and the first thermal resistance value of said each element, calculates a second element temperature of said each element based on the first and second heat generation temperatures and the first element temperature of said each element, and calculates a second voltage value, a second current value, and a second thermal resistance value at said each element at the second element temperature based on previously given data indicative of temperature dependency of said each element.

12. The circuit simulator according to claim 11, wherein said simulation unit repeats a process, said process comprising: calculating the difference between the first voltage value and the second voltage value for each of the plurality of elements, and calculating a voltage variation which is an addition sum of the differences; calculating the difference between the first current value and the second current value for each of the plurality of elements, and calculating a current variation which is an addition sum of the differences; calculating the difference between the first thermal resistance value and the second thermal resistance value for each of the plurality of elements, and calculating a thermal resistance variation which is an addition sum of the differences; changing each value of the first voltage value, first current value, and first thermal resistance value until the respective voltage variation, current variation, and the thermal resistance variation decrease to previously set convergence condition values or less, to calculate the second element temperature for each of the plurality of elements; and calculating the second voltage value, second current value, and second thermal resistance value at the second element temperature.

13. The circuit simulator according to claim 12, wherein:
when, the number of the plurality of elements is N, the number of times of repetitions is k for processing performed when at least one of the voltage variation and current variation exceeds a previously set convergence condition value, the amount of heat flowing from an m-th element ($1 \leq m \leq N$) into an n-th element ($1 \leq n \leq N$) of the plurality of elements is Qi(n,m,k), and the first voltage value and first current value of the m-th element are V(m,k) and I(m,k), respectively, said Qi(n,m,k) is given by:

$$Qi(n,m,k)=A \times [V(m,k) \times I(m,k)]$$

where A is a coefficient.

14. The circuit simulator according to claim 13, wherein said coefficient A is time dependent.

15. The circuit simulator according to claim 13, wherein said n-th element is a current source element, and said coefficient A is a current gain of said current source element.

16. The circuit simulator according to claim 12, wherein:
when, the number of the plurality of elements is N, the number of times of repetitions is k for processing performed when at least one of the voltage variation and current variation exceeds a previously set convergence condition value, the amount of heat flowing from an m-th element ($1 \leq m \leq N$) into an n-th element ($1 \leq n \leq N$) of the plurality of elements is Qi(n,m,k), an element temperature at the m-th element is T(m,0) when the k is zero, and the element temperature at the m-th element is T(m,k) when the k is other than zero, said Qi(n,m,k) is given by:

$$Qi(n,m,k)=B \times [T(m,k)-T(m,0)]$$

where B is a coefficient.

17. The circuit simulator according to claim 16, wherein said coefficient B is time dependent.

18. The circuit simulator according to claim 16, wherein said n-th element is a voltage controlled current source element, and said coefficient B is a transconductance of said voltage controlled current source element.

19. The circuit simulator according to claim 11, wherein said simulation unit is provided with layout data including shape data related to each of the plurality of elements, and derives the first thermal resistance value for each of the plurality of elements using the shape data of an applicable element on the layout data.

20. The circuit simulator according to claim 11, wherein said simulation unit is provided with layout data including distance data between each element of the plurality of elements, and calculates the second heat generation temperature for each of the plurality of elements using applicable distance data between elements on the layout data instead of using the first thermal resistance value.

21. A method of simulating a semiconductor integrated circuit comprised of a plurality of elements, said method comprising:
executing an electric circuit simulation for said semiconductor integrated circuit based on a first element temperature, a first voltage value, a first current value, and a thermal resistance value set as initial conditions for each of the plurality of elements, with reference to an electric circuit network that indicates a connection relation associated with the plurality of elements and a heat circuit network which is a heat equivalent circuit associated with the plurality of elements,
wherein said executing a electric circuit simulation includes calculating a first heat generation temperature for each of the plurality of elements, caused by the amount of self-heat generation of said each element, based on the first voltage value, first current value, and thermal resistance value of said each element, calculating a second heat generation temperature caused by the amount of heat flowing from the other element into said each element based on the first voltage value and first current value of the other element and the thermal resistance value of said each element, calculating a second element temperature of said each element based on the first and second heat generation temperatures and the first element temperature of said each element, and calculating a second voltage value and a second current value at said each element at the second element temperature based on previously given data indicative of temperature dependency of said each element.

22. The circuit simulation method according to claim 21, wherein said executing an electric circuit simulation includes repeating a process, said process comprising: calculating the difference between the first voltage value and the second voltage value for each of the plurality of elements, and calculating a voltage variation which is an addition sum of the differences; calculating the difference between the first current value and the second current value for each of the plurality of elements, and calculating a current variation which is an addition sum of the differences; changing each value of the first voltage value and first current value until both the voltage variation and current variation decrease to previously set convergence condition values or less to calculate the second element temperature for each of the plurality of elements; and calculating the second voltage value and second current value at the second element temperature.

23. A method of simulating a semiconductor integrated circuit comprised of a plurality of elements, said method comprising:
executing an electric circuit simulation for said semiconductor integrated circuit based on a first element temperature, a first voltage value, a first current value, and a first thermal resistance value set as initial conditions for each of the plurality of elements, with reference to an electric circuit network that indicates a connection relation associated with the plurality of elements and a heat circuit network which is a heat equivalent circuit associated with the plurality of elements,
wherein said executing an electric circuit simulation includes:
calculating a first heat generation temperature for each of the plurality of elements, caused by the amount of self-heat generation of said each element, based on the first voltage value, first current value, and first thermal resistance value of said each element, calculating a second heat generation temperature caused by the amount of heat flowing from the other element into said each element based on the first voltage value and first current value of the other element and the first thermal resistance value of said each element, calculating a second element temperature of said each element based on the first and second heat generation temperatures and the first element temperature of said each element, and calculating a second voltage value, a second current value, and a second thermal resistance value at said each element at the second element temperature based on previously given data indicative of temperature dependency of said each element.

24. The circuit simulation method according to claim 23, wherein said executing an electric circuit simulation includes repeating a process, said process comprising: calculating the difference between the first voltage value and the second voltage value for each of the plurality of elements, and calculating a voltage variation which is an addition sum of the differences; calculating the difference between the first current value and the second current value for each of the plurality of elements, and calculating a current variation which is an addition sum of the differences; calculating the difference between the first thermal resistance value and the second thermal resistance value for each of the plurality of elements, and calculating a thermal resistance variation which is an addition sum of the differences; changing each value of the first voltage value, first current value, and first thermal resistance value until the respective voltage variation, current variation, and the thermal resistance variation decrease to previously set convergence condition values or less, to calculate the second element temperature for each of the plurality of elements; and calculating the second voltage value, second current value, and second thermal resistance value at the second element temperature.

25. A recording medium recorded with a program for causing a computer to execute a process for executing an electric circuit simulation for a semiconductor integrated circuit based on a first element temperature, a first voltage value, a first current value, and a thermal resistance value set as initial conditions for each of a plurality of elements which make up said semiconductor integrated circuit, with reference to an electric circuit network indicative of a connection relation associated with the plurality of elements and a heat circuit network which is a heat equivalent circuit associated with the plurality of elements, wherein said process for executing an electric circuit simulation includes processing for calculating a first heat generation temperature for each of the plurality of elements, caused by the amount of self-heat generation of said each element, based on the first voltage value, first current value, and thermal resistance value of said each element, processing for calculating a second heat generation temperature caused by the amount of heat flowing from the other element into said each element based on the first voltage value and first current value of the other element and the thermal resistance value of said each element, processing for calculating a second element temperature of said each element based on the first and second heat generation temperatures and the first element temperature of said each element, and processing for calculating a second voltage value and a second current value at said each element at the second element temperature based on previously given data indicative of temperature dependency of said each element.

26. The recording medium according to claim 25, wherein said process for executing an electric circuit simulation includes repeating a process which comprises: calculating the difference between the first voltage value and the second voltage value for each of the plurality of elements, and calculating a voltage variation which is an addition sum of the differences; calculating the difference between the first current value and the second current value for each of the plurality of elements, and calculating a current variation which is an addition sum of the differences; changing each value of the first voltage value and first current value until both the voltage variation and current variation decrease to previously set convergence condition values or less, to calculate the second element temperature for each of the plurality of elements; and calculating the second voltage value and second current value at the second element temperature.

27. A recording medium recorded with a program for causing a computer to execute a process for executing an electric circuit simulation for a semiconductor integrated circuit based on a first element temperature, a first voltage value, a first current value, and a first thermal resistance value set as initial conditions for each of a plurality of elements which make up said semiconductor integrated circuit, with reference to an electric circuit network indicative of a connection relation associated with the plurality of elements and a heat circuit network which is a heat equivalent circuit associated with the plurality of elements, wherein said process for executing an electric circuit simulation includes processing for calculating a first heat generation temperature for each of the plurality of elements, caused by the amount of self-heat generation of said each element, based on the first voltage value, first current value, and first thermal resistance value of said each element, processing for calculating a second heat generation temperature caused by the amount of heat flowing from the other element into said each element based on the first voltage value and first current value of the other element and the first thermal resistance value of said each element, processing for calculating a second element temperature of said each element based on the first and second heat generation temperatures and the first element temperature of said each element, and processing for calculating a second voltage value, a second current value, and a second thermal resistance value at said each element at the second element temperature based on previously given data indicative of temperature dependency of said each element.

28. The recording medium according to claim 27, wherein said process for executing an electric circuit simulation includes repeating a process which comprises: calculating the difference between the first voltage value and the second voltage value for each of the plurality of elements, and calculating a voltage variation which is an addition sum of the differences; calculating the difference between the first current value and the second current value for each of the plurality of elements, and calculating a current variation which is an addition sum of the differences; calculating the difference between the first thermal resistance value and the second thermal resistance value for each of the plurality of elements, and calculating a thermal resistance variation which is an addition sum of the differences; changing each value of the first voltage value, first current value, and first thermal resistance value until the respective voltage variation, current variation, and the thermal resistance variation decrease to previously set convergence condition values or less, to calculate the second element temperature for each of the plurality of elements; and calculating the second voltage value, second current value, and second thermal resistance value at the second element temperature.

* * * * *

UNITED STATES PATENT AND TRADEMARK OFFICE
CERTIFICATE OF CORRECTION

| | | |
|---|---|---|
| PATENT NO. | : 8,332,190 B2 | Page 1 of 1 |
| APPLICATION NO. | : 12/517258 | |
| DATED | : December 11, 2012 | |
| INVENTOR(S) | : Tanomura et al. | |

It is certified that error appears in the above-identified patent and that said Letters Patent is hereby corrected as shown below:

In the Specification

Column 1, Line 3: insert -- This application claims the priority of Japanese Patent Application no. 2006-341276 filed on December 19, 2006, the disclosure of which is herein incorporated by reference in its entirety. --

Column 7, Line 22: Delete "εV," and insert -- εv, --

Column 9, Line 45: Delete "εV," and insert -- εv, --

Column 12, Line 40-43: delete "This application claims the priority of Japanese Patent Application No. 2006-341276 filed on Dec. 19, 2006, the disclosure of which is herein incorporated by reference in its entirety"

In the Claims

Column 17, Line 23: Claim 25, after "A", insert -- non-transitory --

Column 18, Line 8: Claim 27, after "A", insert -- non-transitory --

Signed and Sealed this
Fourth Day of November, 2014

Michelle K. Lee
*Deputy Director of the United States Patent and Trademark Office*